United States Patent
Bovier et al.

(10) Patent No.: US 7,005,953 B2
(45) Date of Patent: Feb. 28, 2006

(54) MAGNET SYSTEM WITH SHIELDED REGENERATOR MATERIAL

(75) Inventors: Pierre-Alain Bovier, Zurich (CH); Patrik Vonlanthen, Schwerzenbach (CH); Andreas Kraus, Riedikon (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/114,153

(22) Filed: Apr. 26, 2005

(65) Prior Publication Data

US 2005/0253676 A1 Nov. 17, 2005

(30) Foreign Application Priority Data

May 11, 2004 (DE) ................... 10 2004 023 072

(51) Int. Cl.
*H01F 7/00* (2006.01)
*F17C 5/02* (2006.01)
(52) U.S. Cl. ................. 335/301; 62/51.1; 335/216
(58) Field of Classification Search ........... 335/216, 335/301; 62/47.1, 51.1
See application file for complete search history.

(56) References Cited

U.S. PATENT DOCUMENTS 5,701,744 A * 12/1997 Eckels et al. ............. 62/47.1
6,029,458 A 2/2000 Eckels
2005/0110602 A1 * 5/2005 Westphal ................. 335/301

FOREIGN PATENT DOCUMENTS

EP 0 905 434 3/1999
EP 0 905 524 3/1999

* cited by examiner

*Primary Examiner*—Ramon M. Barrera
(74) *Attorney, Agent, or Firm*—Paul Vincent

(57) ABSTRACT

A magnet system with a magnet arrangement (M), a working volume (V) and a pulse tube cooler (P) with magnetic regenerator material (r) is characterized in that a shielding (m) of magnetic material is provided which reduces the stray field of the magnet arrangement at the location of the magnetic regenerator material (r) and is characterized in that $$\tfrac{1}{3}|\tilde{m}_{Reg}R|+|m_{Mag}\Delta x|<\tfrac{1}{6}|m_{Reg}R|,$$

wherein $m_{Mag}$ is the dipole moment of the magnetic material of the shielding (m), $\Delta\chi$ is the vibration amplitude of the magnetic material of the shielding (m), $m_{Reg}$ is the amplitude of the dipole fluctuations of the magnetic regenerator material (r) in one cycle without magnetic shielding (m), $\tilde{m}_{Reg}$ is the amplitude of the dipole fluctuations of the magnetic regenerator material (r) in one cycle with magnetic shielding (m), and R is the average separation of the magnetic regenerator material (r) from the working volume (V). A magnet system of this type has an optimum stable, temporally constant magnetic field in the working volume (V).

30 Claims, 3 Drawing Sheets

| | Shield 1 | Shield 2 |
|---|---|---|
| $D$ [mm] | 35 | 70 |
| $L$ [mm] | 120 | 240 |
| $d$ [mm] | 0.6 | 1.2 |
| $\Delta x$ [mm] | 0.01 | 0.01 |
| $\|m_{Mag}\|$ [A*m$^2$] | 3.2 | 25 |
| $\|m_{Mag}\Delta x\|$ [A*m$^3$] | $3.2*10^{-5}$ | $2.5*10^{-4}$ |
| $\frac{1}{6}\|m_{Reg}R\|$ [A*m$^3$] | $10^{-4}$ | $10^{-4}$ |

Tab. 1

MAGNET SYSTEM WITH SHIELDED REGENERATOR MATERIAL

This application claims Paris Convention priority of DE 10 2004 023 072.2 filed May 11, 2004 the complete disclosure of which is hereby incorporated by reference.

BACKGROUND OF THE INVENTION

The invention concerns a magnet system with a magnet arrangement, a working volume and a pulse tube cooler with magnetic regenerator material.

The use of pulse tube coolers to cool elements in a magnet arrangement is disclosed e.g. in EP 0 905 434. The pulse tube cooler therein is used to cool the helium bath to temperatures below 4.2 K. The magnet coils located therein can generate a higher field than at 4.2 K, since lower temperatures permit higher current flow through the superconductor.

U.S. Pat. No. 6,029,458 discloses a magnet arrangement with a piston refrigerator which comprises a slider made of materials having a magnetic phase transition. A superconducting sleeve surrounds the refrigerator to shield the disturbing fields generated by motion of the slider, and is disposed between the cold end of the refrigerator and the volume under investigation. The superconducting sleeve thereby surrounds 90° to 270° of the cold end of the refrigerator. The magnetic disturbing field of the regenerator material induces an opposite magnetic field in the sleeve such that the magnetic flux through the sleeve is kept constant. Thereby the disturbing field is compensated for. It has, however, turned out that arrangements of this type are highly susceptible to quenches and therefore do not provide reliable and stable shielding. Fields parallel to the sleeve can moreover not be compensated for, since adequate shielding currents cannot flow due to the incomplete periphery of 90° to 270°.

EP 0 905 524 discloses a magnet system with a superconducting magnet arrangement and a pulse tube cooler. The pulse tube cooler of this magnet system is disposed in a suspension tube of the system. It can re-liquefy an evaporating cryogenic liquid.

Pulse tube coolers vibrate much less than other coolers, which is a great advantage for magnet systems which are susceptible to disturbances. To permit cooling of low-temperature superconductors, temperatures of 4.2 K and below are of interest. Pulse tube coolers with magnetic regenerator materials have a particularly high cooling efficiency in this temperature range. In particular, rare earths in the regenerator material of a pulse tube cooler provide good cooling efficiency even at temperatures down to 4.2 K. This good cooling performance is due to the large thermal capacity of the rare earths in the vicinity of their magnetic phase transition. Due to this phase transition, the rare earths are magnetized by the stray field of the magnet arrangement. The magnetic properties of the regenerator material also change with temperature and within a cooling cycle. The magnetization in the stray field of the magnet arrangement therefore changes periodically and this magnetization fluctuation causes a temporally varying electromagnetic disturbance in the working volume of the magnet arrangement. This time dependent magnetization was not disclosed in the EP 0 905 434 patent document, since this document assumes that the magnetization of the regenerator material only generates a static homogeneity disturbance in the working volume, which would not present a problem.

It is the underlying purpose of the present invention to provide a magnet system which has a pulse tube cooler with a magnetic regenerator material which nevertheless realizes a temporally constant magnetic field in the working volume with optimum stability.

SUMMARY OF THE INVENTION

This object is achieved in accordance with the invention by providing a shielding of magnetic material which reduces the stray field of the magnet arrangement at the location of the magnetic regenerator material and is characterized in that $$|\tfrac{1}{3}\tilde{m}_{Reg}R + m_{Mag}\Delta x| < |\tfrac{1}{6}m_{Reg}R|$$

wherein $m_{Mag}$ is the dipole moment of the magnetic material of the shielding, $\Delta x$ is the vibration amplitude of the magnetic shielding material, $m_{Reg}$ is the amplitude of the dipole fluctuations of the magnetic regenerator material in one cycle without magnetic shielding, $\tilde{m}_{Reg}$ is the amplitude of the dipole fluctuations of the magnetic regenerator material in one cycle with magnetic shielding and R is the average separation of the magnetic regenerator material from the working volume.

The inventive magnetic shielding material shields the stray field of the magnet arrangement at the location of the magnetic regenerator material. The dipole fluctuations of the magnetic regenerator material can thereby be reduced and the resulting electromagnetic disturbances in the working volume of the magnet arrangement can be efficiently suppressed. Since soft magnetic material attracts field lines and thereby shields the inner magnetic field, it is particularly suited for shielding the magnetic regenerator material.

The stray field of the magnet arrangement magnetizes the material of the hollow cylinder which becomes a magnetic dipole. Although pulse tube coolers are coolers with minimum vibration, minor vibrations are nevertheless present and may be transmitted to the magnetic shielding material. The inventive magnetic shielding material can therefore be regarded as a vibrating magnetic dipole which generates a periodic electromagnetic disturbance in the working volume of the magnet arrangement that may even be larger than the original disturbance of the magnetic regenerator material. To avoid this problem, the size of the field disturbance due to both the magnetic regenerator material and to the magnetic shielding in the working volume of the magnet arrangement must be estimated and the shielding parameters must be correspondingly determined. If the above-mentioned inequality $$|\tfrac{1}{3}\tilde{m}_{Reg}R + m_{Mag}\Delta x| < |\tfrac{1}{6}m_{Reg}R|$$

is satisfied, the disturbance which is generated by the vibrating shielding in the working volume is smaller by at least a factor of two than that which would be generated by the magnetic regenerator material without magnetic shielding. The disturbances caused by operation of a pulse tube cooler with magnetic regenerator material in the working volume of the inventive magnet system are therefore considerably reduced compared to the situation in conventional magnet systems.

Pulse tube coolers are used in the inventive magnet system e.g. for cooling a superconducting magnet arrangement or parts of a cryostat in which the superconducting magnet arrangement is located. The low temperatures are necessary in a magnet system of this type due to the superconducting properties of the wires. Magnet systems of this type are used e.g. to generate extremely high, homogeneous magnetic fields.

In a further field of application, the pulse tube cooler cools measuring devices in the working volume of the magnet arrangement to advantageously reduce the thermal noise in the signal. In particular, in magnetic resonance spectroscopy, cooling of the measuring device reduces the noise level in the signal to such an extent that considerably shorter measuring times are possible.

In a particularly preferred embodiment of the magnet system, the magnetic shielding material has a maximum permeability $\mu_{max}$ of at least 10,000. The maximum permeability is the largest value of the relative permeability, which, in turn, is a function of the field strength. Since the relative permeability is a measure of the shielding effect, the stray field of the magnet arrangement at the location of the magnetic regenerator material is optimally shielded by a magnetic shielding material having a high maximum permeability. Moreover, as long as the magnetic shielding is not magnetically saturated, it can advantageously counteract residual disturbances, which might still be generated in the magnetic regenerator material, by varying its magnetization and thereby further reduce the disturbing amplitude in the working volume.

In a particularly preferred manner, the saturation induction of the magnetic material is at least 1 Tesla, preferably 2 Tesla. Thus, even a relatively strong stray field of the magnet arrangement can be compensated for at the location of the magnetic regenerator material using little shielding material. With high saturation induction, the magnetic material does not easily become magnetically saturated and continues to shield the stray field of the magnet arrangement at the location of the magnetic regenerator material. On the other hand, it can, by variation of its magnetization, also counteract residual disturbances in the working volume generated by the magnetic regenerator material.

In a preferred embodiment, the magnetic shielding comprises at least one hollow cylinder which surrounds the magnetic regenerator material to be shielded. Since the regenerator usually has a cylindrical geometry, a hollow cylinder is the simplest embodiment for the magnetic shielding. Shielding materials are typically produced in sheets. The desired geometry is simply obtained through wrapping the sheet about a cylindrical carrier.

In a particularly preferred embodiment, the inner part of the hollow cylinder consists of a material with a high permeability $\mu_{max}>10,000$ whereas the outer part consists of a material having a high saturation induction >1 Tesla. The high saturation induction of the outer material greatly reduces the stray field of the magnet arrangement, wherein the inner part of the hollow cylinder with high permeability is already located in a highly reduced field which can then be optimally shielded. In particular, good shielding of a strong stray field of the magnet arrangement at the location of the regenerator is provided, thereby suppressing generation of electromagnetic disturbance in the magnetic regenerator material.

The outer diameter of the hollow cylinder is preferably smaller than 1.5 times the outer diameter of the magnetic regenerator material to be shielded. The smaller the outer diameter of the hollow cylinder, the smaller the dipole moment of the magnetic material of the hollow cylinder, such that the required condition, i.e.

$$\tfrac{1}{3}\tilde{m}_{Reg}R|+|m_{Mag}\Delta x|<\tfrac{1}{6}|m_{Reg}R|$$

is met. A small outer diameter of the hollow cylinder also prevents magnetic saturation of the soft magnetic material. For this reason, the stray field of the magnet arrangement at the location of the magnetic regenerator material is still shielded and the disturbances in the working volume which might still be produced by the magnetic regenerator material can also be reduced through compensating variation of the magnetization of the hollow cylinder.

In a preferred embodiment of the inventive magnet system, at least one axial end of the hollow cylinder extends beyond the magnetic regenerator material to be shielded by at least one third of the inner diameter of the hollow cylinder. The extension of the hollow cylinder beyond the actual dimensions of the magnetic regenerator material to be shielded ensures that the stray field of the magnet arrangement at the location of the magnetic regenerator material is actually reduced by the shielding. Concentrated field lines must leave the magnetic material at the axial ends of the hollow cylinder, which causes local field increases mainly of fields parallel to the axis of the cylinder.

In a particularly preferred embodiment, at least one axial end of the hollow cylinder extends beyond the magnetic regenerator material to be shielded by at most twice the inner diameter of the hollow cylinder. Since saturation of the magnetic material is accelerated with increasing length of the hollow cylinder, the hollow cylinder is preferably as short as possible, wherein the above-described edge effects must be taken into consideration in the choice of the dimensions of the hollow cylinder to obtain a satisfying shielding effect.

In a preferred embodiment of the inventive magnet system, the magnetic regenerator material to be shielded only contains regions of the regenerator material having magnetization fluctuations which exceed 10% of the maximum magnetization fluctuations within the entire regenerator material during regenerator operation. The volume of the magnetic material of the shielding is thereby reduced to an acceptable minimum which saves material costs and the disturbances caused by vibrations of the shielding are minimized.

A further advantage can be obtained if at least one part of the magnetic material is not magnetically saturated during operation, since magnetically saturated material cannot shield part of the stray field of the magnet arrangement. Further disturbances in the working volume which could be generated by the regenerator material cannot be compensated for when the magnetic material is saturated.

With particular preference, the magnetic shielding material is temperature stabilized, in particular, connected in a thermally conducting fashion to a radiation shield, a cold stage of the pulse tube cooler or a container with cryogenic liquid. This is of particular interest if the shielding is located close to the magnetic regenerator material, since the temperature fluctuations generated in the magnetic regenerator material can also be transferred to the magnetic material of the shielding. Otherwise, the magnetic shielding would constitute a time-dependent magnetic dipole due to its temperature-dependent magnetic properties and would generate undesired electromagnetic disturbances in the working volume.

To suppress the temperature fluctuations in the magnetic shielding, the shielding of magnetic material may be thermally insulated from the magnetic regenerator material. Thermal insulation could encompass reduction of thermal transmission, thermal radiation and/or convection.

In a further embodiment of the inventive magnet system, a shielding material having good conducting properties is provided around the magnetic regenerator material in addition to the magnetic shielding to compensate for residual disturbances. Vibrations of the magnetic shielding or still existing dipole fluctuations of the magnetic regenerator material can thereby be compensated for by forming an opposite field via shielding currents in a material having good electrical conducting properties.

In a particularly preferred embodiment of the invention, the shielding of material having good electrical conducting properties comprises cylindrically symmetrical parts, and the magnetic field changes of the magnetic regenerator material and/or the magnetic shielding at the location of the shielding with good electrical conducting properties are mainly in the direction of the corresponding cylinder axis. A cylinder of material having good electrical conducting properties can optimally compensate for field fluctuations parallel to its axis in a volume outside the cylinder, since the shielding currents can flow in the peripheral direction without being disturbed.

The material having good electrical conducting properties is preferably a low-temperature superconductor. The vanishing resistance of a superconductor permits resistance-free build up of induction currents, and disturbances can be optimally compensated for. The use of a low-temperature superconductor, however, requires sufficiently low ambient temperatures. Such low temperatures can be obtained e.g. through thermal contact between the superconductor and a cold stage of the pulse tube cooler or with a cold container in the cryostat.

The low temperatures which are required to generate superconductivity using a low-temperature superconductor cannot be ensured in all cases. For this reason, in one embodiment of the inventive magnet system, the material having good electrically conducting properties may be a high-temperature superconductor. The temperature required may be obtained e.g. through thermal contact between the superconductor and the first stage of a two-stage pulse tube cooler or with a cold container in the cryostat.

In a preferred embodiment of the invention, the material having good electrical conducting properties consists of bulk material, e.g. of a cylindrical block. In this embodiment, the shielding currents can flow in all directions to provide optimum compensation of the electromagnetic disturbances.

In a particularly preferred embodiment, the material having good electrical conducting properties forms a solenoid coil. Since superconductors are available in the form of bands or wires, winding into a solenoid coil is straightforward.

It is also advantageous to provide the superconducting magnet arrangement with coils for stray field suppression. An active shielding of this type reduces the magnetic field at the location of the magnetic regenerator material and the disturbances caused thereby such that the above-described magnetic material shielding devices must only compensate for a reduced stray field.

The magnetic field at the location of the magnetic regenerator material preferably does not exceed 10 mT. A field of this amplitude can be shielded with a reasonable amount of soft magnetic material.

The superconducting magnet arrangement advantageously comprises coils which suppress the electromagnetic disturbances of the magnetic regenerator material. Additional coils of this type can compensate for possibly residual disturbances of the magnetic regenerator material in the working volume.

The periodically changing pressure wave in the regenerator material produces vibrations which can be transferred to the magnetic shielding. The compressor of the pulse tube cooler or floor vibrations can also cause oscillation of the magnetic shielding. For this reason, the superconducting magnet arrangement advantageously comprises coils which suppress the electromagnetic disturbances of the vibrating magnetic shielding.

In one embodiment of the inventive magnet system, the cryostat of the superconducting magnet arrangement contains a radiation shield which is brought to its operating temperature by the pulse tube cooler. Cooling of the radiation shield reduces the energy input of the warm surroundings into the superconducting magnet arrangement.

In a further embodiment of the inventive magnet system, the cryostat of the superconducting magnet arrangement has a container with liquid nitrogen which is at least partially re-liquefied by the pulse tube cooler after evaporation to reduce or eliminate consumption of liquid nitrogen.

In a magnet arrangement with superconductors, liquid helium may be used for cooling. In a preferred embodiment of the inventive magnet system, the evaporating liquid helium is at least partially re-liquefied by the pulse tube cooler thereby reducing or eliminating helium consumption.

In another embodiment of the invention, the magnet arrangement is brought to and/or kept at its operating temperature by the pulse tube cooler without a cryogenic liquid, thereby partially or completely eliminating time-consuming and expensive handling with cryogenic liquids.

The advantages of the inventive magnet system are particularly effective if the superconducting magnet arrangement is part of a nuclear magnetic resonance apparatus, in particular, a magnetic resonance imaging (MRI) or magnetic resonance spectroscopy (NMR) apparatus since these apparatuses require a particularly stable magnetic field.

The invention moreover concerns a method for operating a magnet system as claimed, wherein a superconducting shielding material is inductively charged during charging of the magnet arrangement. This inductive charging of the superconducting material during charging of the magnet arrangement compensates for or reduces the stray field of the magnet arrangement at the location of the magnetic regenerator material to prevent or limit undesired magnetization of the magnetic regenerator material.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

Table 1 shows two shielding variants with different geometries.

DESCRIPTION OF THE PREFERRED EMBODIMENT

To suppress the electromagnetic disturbances generated by the fluctuations of magnetization of the magnetic regenerator material r in the working volume V, the magnetic field at the location of the magnetic regenerator material r can be shielded. Soft magnetic material, which attracts field lines, is particularly suited for this purpose since it shields the magnetic field in its interior.

Figure 1:
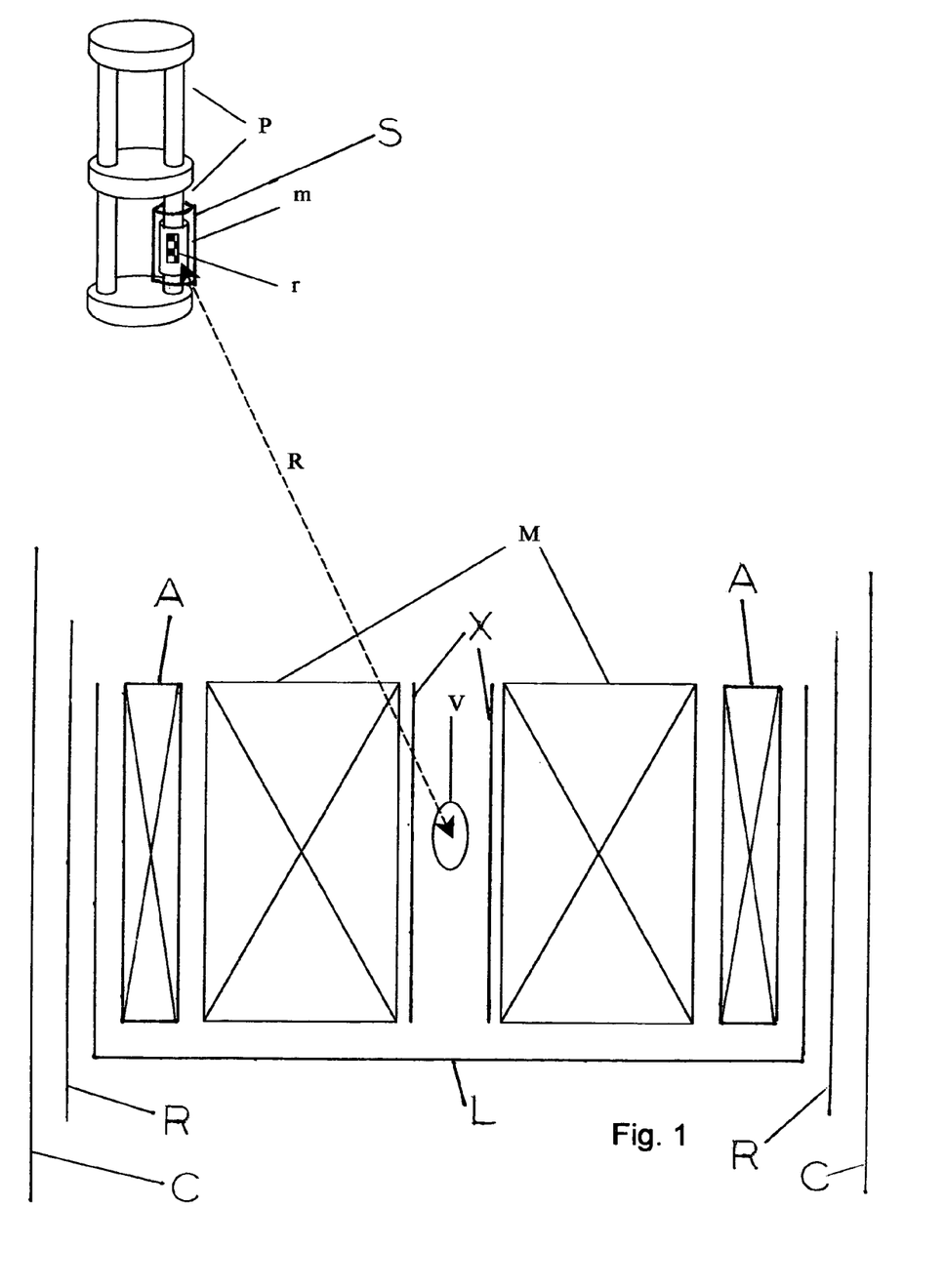
FIG. 1 shows an inventive magnet system with pulse tube cooler and magnetic shielding in the form of a cylinder.

FIG. 1 shows an inventive magnet system M which has a working volume V and a two-stage pulse tube cooler P with a magnetic shielding m far away from the magnet system M. The magnetic shielding m surrounds the magnetic regenerator material r of the second stage of the pulse tube cooler P and is shown herein in a particularly simple embodiment, i.e. in the form of a hollow cylinder. This magnetic shielding m may consist e.g. of soft magnetic material. Since soft magnetic material is often produced in the form of sheets, the cylindrical shape can be easily obtained through wrapping this sheet about a cylindrical carrier. The desired wall thickness of the magnetic shielding m can be obtained through a suitable number of layers. Since the BH curve of a soft magnetic material depends on the temperature, temperature fluctuations of the magnetic shielding should be avoided. A thermal insulating layer may be provided between the soft magnetic material and the magnetic regenerator material r and thermal contact between the soft magnetic material and existing temperature-stable parts of the arrangement may also have the same effect. Temperature-stable parts of the arrangement may e.g. be a cryogenic liquid or a container cooled thereby. Another possibility would be the ends of the pulse tube cooler which have a defined temperature during operation.

FIG. 1 also schematically illustrates a cryostat C, a container of cryostat liquid L, a radiation shield R, a shielding material having good electrical conducting properties which can be configured as a solenoid S, coils for stray field suppression A, and coils which suppress electromagnetic disturbances of the magnetic regenerator material X.

The following discussion is based on a soft magnetic material geometry of a hollow cylinder having an inner diameter D, height L and wall thickness d although other geometries would also produce similar results. For reasons of simplicity, the magnetic regenerator material r is assumed to have the geometry of a solid cylinder of diameter $D_{Reg}$ and a height $L_{Reg}$, wherein this solid cylinder shall be disposed within the hollow cylinder of magnetic material. It is emphasized that this solid cylinder comprises only that part of the magnetic regenerator material r in which the temperature fluctuations produce considerable magnetization fluctuations.

Fields perpendicular to the cylinder axis are shielded by a factor $$S_s = 1 + \frac{\mu_r d}{D}.$$

at the center of the hollow cylinder.

For fields parallel to the cylinder axis, the shielding factor is $$S_p = 1 + \frac{4N(S_s - 1)}{1 + \frac{D}{2L}}$$

with the so-called demagnetization factor N which depends on the ratio L/D. It is thereby assumed that $\mu_r \gg 1$. This formula applies for cylinders which are closed on both sides and therefore only for long hollow cylinders. Clearly, good shielding is obtained for high values of the relative permeability $\mu_r$. The relative permeability is defined by the relationship $$B = \mu_0 \mu_r H$$

and is a function of the field B (this relationship between B and H defines the so-called BH curve of the material). For soft magnetic materials which are discussed in the present patent application, $\mu_r$ reaches a maximum $\mu_{max}$ at low fields and decreases for large fields with an asymptotic value of 1. The magnetic material is saturated when an increase $\Delta H$ produces an increase $$\Delta B = \mu_0 \Delta H.$$

It can no longer influence larger fields since all spins in the material are already oriented. The self field of the magnetic material is thereby called the saturation induction $B_s$ and is given by $$B_s = B - \mu_0 H$$

The value $B/\mu_0 - H$ is called "magnetization", even for fields which are far away from saturation.

Figure 2:
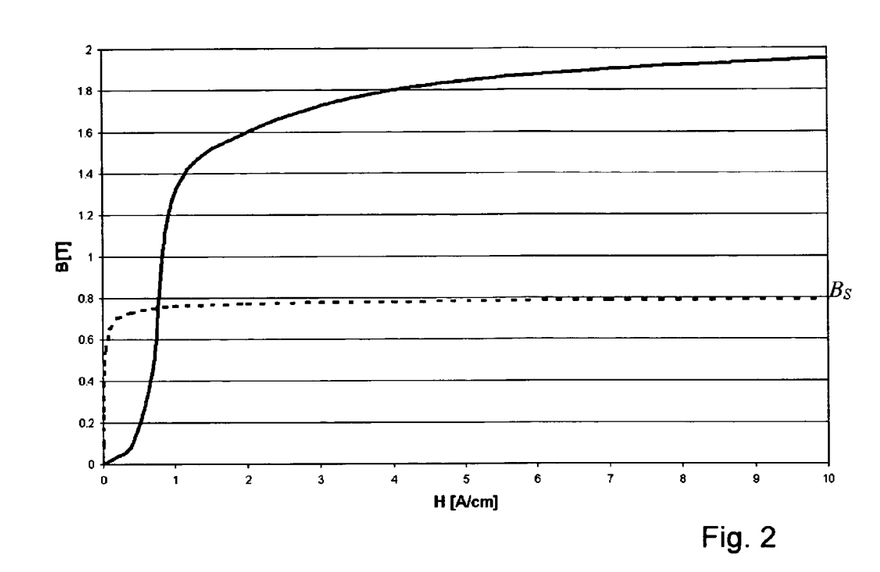
FIG. 2 shows typical BH curves of a soft-magnetic material with high maximum permeability and a soft magnetic material with high maximum saturation induction.

FIG. 2 shows typical BH curves for soft magnetic materials with high maximum permeability (dashed line) or high maximum saturation induction (solid line). The very steep increase of the BH curve for materials with a large maximum permeability $\mu_{max}$ with already small field strengths H shows that materials of this type are suited for effective shielding of small magnetic fields. Typically, such materials also have a small saturation induction $B_s$ (in this case 0.8 T) with the consequence that these materials are magnetically saturated by larger magnetic fields. Magnetic saturation means that part of the magnetic field can enter into the hollow cylinder. To avoid magnetic saturation, either the wall thickness of the material may be increased or material having a higher saturation induction (but smaller maximum permeability $\mu_{max}$) may be used. As is shown in FIG. 2, the BH curve of materials having a higher saturation induction has a less steep rise, which reduces the shielding effect. For strong stray fields, a material having a high saturation induction may be used in the outer radial region of the hollow cylinder, and a material with high maximum permeability may be used in its inner radial region. The outer region is brought close to saturation by the stray field of the magnet arrangement and the inner region is already in a strongly reduced field, which can then be optimally shielded.

Figure 3A:
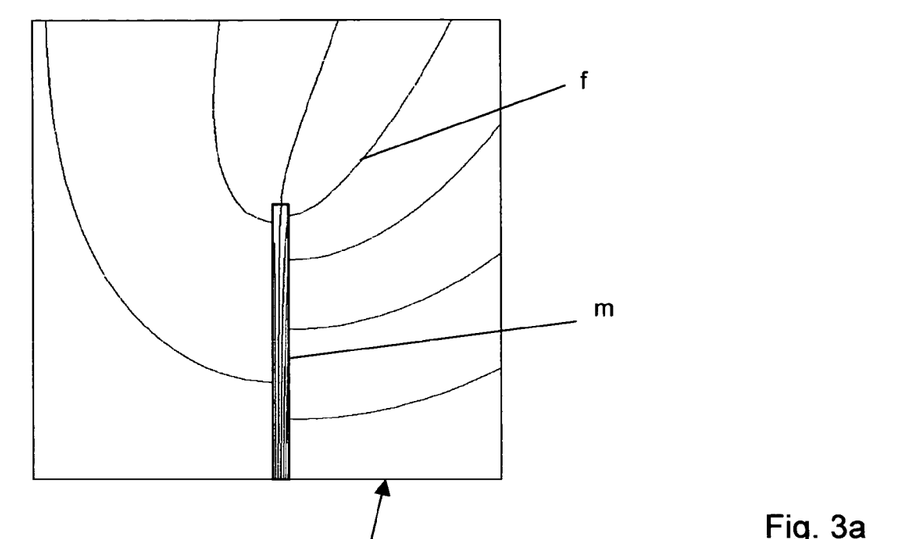
FIG. 3a shows an enlarged section of FIG. 3b.
Figure 3B:
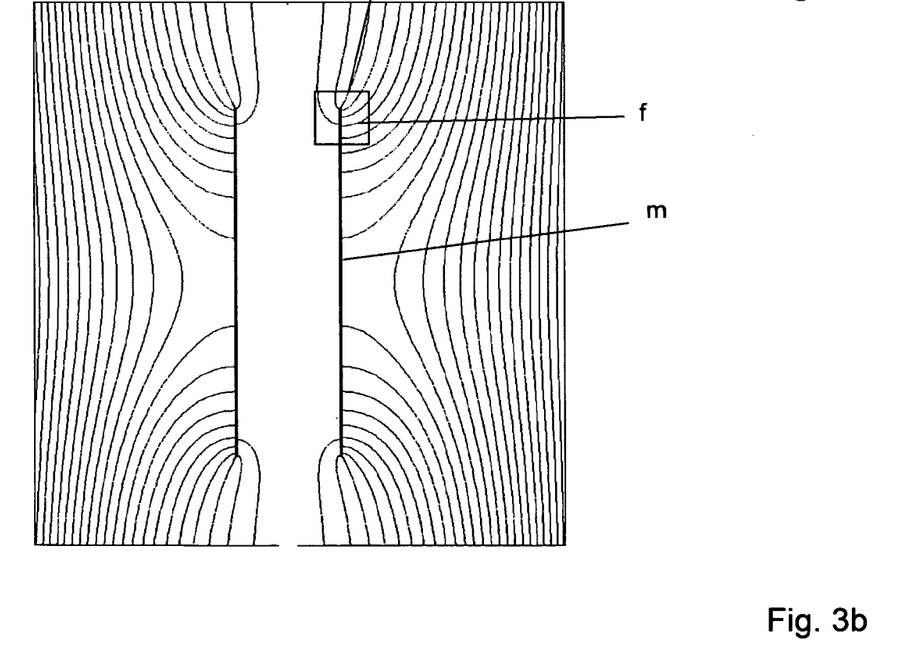
FIG. 3b shows a view of flux lines in the vicinity of a cylindrical shielding m of soft magnetic material.

FIG. 3b shows flux lines f in the vicinity of a cylindrical shielding m of soft magnetic material. In this example, the field without shielding m of soft magnetic material would have an orientation parallel to the cylinder axis. The enlarged section of FIG. 3a shows the concentrated field lines f at the axial edge of the hollow cylinder exiting the magnetic material shielding m. In fact, the field is increased and becomes locally larger than without shielding m. To shield the magnetic field at the location of the magnetic regenerator material r, the height L of the shielding m must be larger than the height $L_{reg}$ of the magnetic regenerator material r. If the hollow cylindrical magnetic shielding m extends beyond the cylinder of the magnetic regenerator material at each axial end by D/3, the magnetic field is typically shielded in the entire solid cylinder of the magnetic regenerator material r by at least a factor of 2. If it extends at both ends beyond the cylinder of the magnetic regenerator material r by more than 2D, the shielding effect cannot be further improved.

The larger the height L of the hollow cylindrical shielding m, the larger the number of magnetic field lines which are attracted by the magnetic material of the shielding m, and the magnetization in the central axial region of the cylinder becomes larger and larger. If the height L of the hollow cylindrical shielding m is too large, the magnetic material at the center height L/2 is magnetically saturated. The magnetic material of the shielding m can no longer absorb field lines close to the saturated regions, so that part of the magnetic field is no longer shielded at that location. The same applies for an increasing diameter D. If D is too large, magnetic saturation occurs and part of the magnetic field can penetrate inside the hollow cylindrical shielding m. To avoid magnetic saturation, either the wall thickness d can be enlarged or the geometrical dimensions L or D of the shielding m can be reduced. The latter option produces a minimum amount of magnetic shielding material which is advantageous as explained below.

The material of the hollow-cylindrical shielding m is magnetized by the stray field of the magnet arrangement and forms a magnetic dipole. Although a pulse tube cooler P is a low vibration cooler, it nevertheless generates minor vibrations. Even with good mechanical decoupling of the hollow cylindrical shielding m and the magnetic regenerator material r, the shielding m is likely to vibrate. The hollow cylindrical shielding m may be regarded as a vibrating magnetic dipole which generates a periodic electromagnetic disturbance in the working volume of the magnet arrangement M which could be larger than the original disturbance of the magnetic regenerator material r. To avoid this problem, the amplitude of the field disturbance from the magnetic regenerator material r and from the magnetic shielding m in the working volume V of the magnet arrangement M must be estimated. In consequence of the temperature fluctuations, the magnetic regenerator material r is a time varying dipole. For an average susceptibility fluctuation with an amplitude $\Delta\chi$ in the volume of the magnetic regenerator material r during one cycle, a dipole change of amplitude $$|m_{Reg}| = \pi \frac{D_{Reg}^2}{4} L_{Reg} |\Delta\chi| \frac{B}{\mu_0},$$

is obtained, wherein B is the stray field of the magnet arrangement M at the location of the magnetic regenerator material r. For reasons of simplicity it is assumed that the direction of this dipole fluctuation is that of the stray field of the magnet arrangement M at the location of the magnetic regenerator material r. Through definition of a cylindrical coordinate system having its origin in the center of the magnetic regenerator material r and with the z axis parallel to the dipole direction, this pulsating dipole produces a disturbance in the working volume of amplitude $$B_{Reg} = \frac{\mu_0 |m_{Reg}|}{4\pi} \frac{\sqrt{4z^2 + \rho^2}}{(\rho^2 + z^2)^2}$$

wherein z is the average axial coordinate and ρ is the average radial coordinate of the working volume V of the magnet arrangement M in this local coordinate system. The vibrating magnetic shielding m in turn generates a stray field in the working volume V of the magnet arrangement M which can be calculated as the difference between two dipole fields. Since the vibration amplitude Δx is small, this difference can be approximated by a derivative. If vibrations in the above defined coordinate system extend in z direction, the resulting disturbance in the working volume V has the amplitude $$B_{Mag} = \frac{\mu_0 |m_{Mag}|}{4\pi} \frac{12|z^3|}{(\rho^2 + z^2)^3} \frac{1}{\sqrt{4z^2 + \rho^2}} |\Delta x| \le$$

$$\frac{\mu_0 |m_{Mag}|}{4\pi} \frac{3|z|(4z^2 + \rho^2)}{(\rho^2 + z^2)^3} \frac{1}{\sqrt{4z^2 + \rho^2}} |\Delta x| \le \le$$

$$\frac{\mu_0 |m_{Mag}|}{4\pi} \frac{3(4z^2 + \rho^2)}{(\rho^2 + z^2)^{5/2}} \frac{1}{\sqrt{4z^2 + \rho^2}} |\Delta x|.$$

If the vibrations extend in ρ direction, the resulting disturbance has the amplitude $$B_{Mag} = \frac{\mu_0 |m_{Mag}|}{4\mu} \frac{3\rho(5z^2 + \rho^2)}{(\rho^2 + z^2)^3} \frac{1}{\sqrt{4z^2 + \rho^2}} |\Delta x| \approx$$

$$\frac{\mu_0 |m_{Mag}|}{4\mu} \frac{3\rho(4z^2 + \rho^2)}{(\rho^2 + z^2)^3} \frac{1}{\sqrt{4z^2 + \rho^2}} |\Delta x| \le \le$$

$$\frac{\mu_0 |m_{Mag}|}{4\mu} \frac{3(4z^2 + \rho^2)}{(\rho^2 + z^2)^{5/2}} \frac{1}{\sqrt{4z^2 + \rho^2}} |\Delta x|$$

With the substitution $R = (\rho^2 + z^2)^{1/2}$, the ratio of the two disturbing amplitudes satisfies the following inequality:

$$\frac{B_{Mag}}{B_{Reg}} \le \frac{3|\Delta x|}{R} \left|\frac{m_{Mag}}{m_{Reg}}\right|.$$

If the inequality $$|m_{Mag} \Delta x| < \frac{1}{6} |m_{Reg} R|$$

is satisfied, the disturbance generated in the working volume V due to the vibrating shielding m is smaller by at least a factor of two than that produced by the magnetic regenerator material r without magnetic shielding m. If the magnetic shielding m does not completely shield the stray field of the magnet arrangement M at the location of the regenerator material, the amount of the remaining disturbance of the magnetic regenerator material r must be added to the left-hand side of the inequality thereby obtaining the more general condition $$\tfrac{1}{3} |\tilde{m}_{Reg} R| + |m_{Mag} \Delta x| < \tfrac{1}{6} |m_{Reg} R|,$$

wherein $\tilde{m}_{Reg}$ is the residual dipole moment of the magnetic regenerator material r in the presence of magnetic shielding m.

To illustrate this inequality, a numerical example is given in which the residual dipole moment $\tilde{m}_{Reg}$ of the magnetic regenerator material r is negligibly small. A stray field of 3 [mTesla] is assumed at the location of the magnetic regenerator material r. This field is parallel to the axis of the regenerator cylinder, which has the dimensions $D_{Reg}$=30 [mm] and $L_{Reg}$=60[mm]. The fluctuation of the susceptibility is $|\Delta\chi|$=0.01. Using the formula $$|m_{Reg}| = \pi \frac{D_{Reg}^2}{4} L_{Reg} |\Delta\chi| \frac{B}{\mu_0}$$

these data produce a dipole moment fluctuation of $|m_{Reg}|=10^{-3}[A^*m^2]$.

The influence of the geometry of the inventive shielding m of magnetic material is shown in the following example:

Table 1 shows two shielding variants whose geometrical sizes differ by a factor of two, but which produce the same shielding effect on the axis of the hollow-cylindrical shielding m. Irrespective of the exact material properties, for sufficient permeability of the material, the magnetization of the hollow cylindrical shielding m of both shielding variants is such that the stray field at the location of the magnetic regenerator material r is well compensated for such that $\tilde{m}_{Reg}$ can be neglected. Magnetization in the material can be calculated with numerical methods (e.g. with the method of finite elements). A magnetization of the shielding material cylinder of approximately $2.4*10^5$[A/m] at both axial ends and of approximately $5.6*10^5$[A/m] in the center is obtained. Both cases exhibit an average magnetization of approximately $4*10^5$[A/m] in the magnetic material of the shielding m. Multiplication of the magnetization by the volume of the material leads to the value for the dipole moment $|m_{Mag}|$ which is given in table 1. If the magnetic regenerator material r is located at an average separation R of 600[mm] from the working volume, one obtains a value of $10^{-4}[A^*m^3]$ for the product $\frac{1}{6}|m_{Reg}R|$. The inequality $$|m_{Mag}\Delta x| < \frac{1}{6}|m_{Reg}R|$$

is satisfied only in the first shielding variant. For the second shielding variant, one can assume that the electromagnetic disturbances which are caused by the vibrations of the magnetic shielding material in the working volume V are approximately equal to the original electromagnetic disturbances of the magnetic regenerator material r to be shielded. The second shielding variant therefore does not satisfy the requirement of reducing the electromagnetic disturbances in the working volume V.

The disturbances produced in the magnetic regenerator material r and in the magnetic material of the shielding m can be further reduced by a shielding having good conducting properties (not shown) and which surrounds both. The shielding having good conducting properties may be superconducting or normally conducting. The advantage of a normally conducting shielding consists in that only shielding currents flow and no permanent currents are present which might otherwise have a negative influence on the homogeneity in the working volume V or the stray field of the magnet arrangement M. There is also no danger of a quench in a normally conducting shielding.

The inventive shielding permits, for the first time, realization of a magnet system which can utilize the advantages of a pulse tube cooler while at the same time compensating for electromagnetic disturbances caused by the pulse tube cooler, such that a stable and temporally constant magnetic field can be realized in the working volume.

We claim:

1. A magnet system comprising:
   a magnet arrangement for generating a magnetic field in a working volume;
   a pulse tube cooler having a magnetic regenerator material; and
   a shielding of magnetic material, said shielding structured and disposed to reduce a stray field of said magnet arrangement at said location of said magnetic regenerator material, wherein $$\frac{1}{3}\tilde{m}_{REG}R + |m_{Mag}\Delta x| < \frac{1}{6}|m_{Reg}R|,$$

with
   $m_{Mag}$ being a dipole moment of the magnetic material of said shielding,
   $\Delta x$ a vibration amplitude of said magnetic material of said shielding,
   $m_{Reg}$ an amplitude of dipole fluctuations of said magnetic regenerator material in one cycle without said magnetic shielding,
   $\tilde{m}_{Reg}$ an amplitude of dipole fluctuations of said magnetic regenerator material in one cycle with said magnetic shielding, and
   R an average separation of said magnetic regenerator material from the working volume.

2. The magnet system of claim 1, wherein the magnet system comprises a superconducting magnet arrangement disposed in a cryostat, wherein said pulse tube cooler cools the magnet arrangement or parts of said cryostat.

3. The magnet system of claim 1, wherein said pulse tube cooler cools a measuring device.

4. The magnet system of claim 1, wherein said magnetic material of said shielding has a maximum permeability $\mu_{max}$ of at least 10,000.

5. The magnet system of claim 1, wherein a saturation induction of said magnetic material is at least 1 Tesla or 2 Tesla.

6. The magnet system of claim 1, wherein said magnetic shielding comprises at least one hollow cylinder which surrounds said magnetic regenerator material.

7. The magnet system of claim 6, wherein an inner part of said hollow cylinder consists essentially of material having a high permeability $\mu_{max}$>10,000 and an outer part of said hollow cylinder consists essentially of material having a high saturation induction >1 Tesla.

8. The magnet system of claim 6, wherein an outer diameter of said hollow cylinder is smaller than 1.5 times an outer diameter of said magnetic regenerator material.

9. The magnet system of claim 6, wherein at least one axial end of said hollow cylinder extends beyond said magnetic regenerator material by at least one third of an inner diameter of said hollow cylinder.

10. The magnet system of claim 6, wherein at least one axial end of said hollow cylinder extends beyond said magnetic regenerator material by at most twice an inner diameter of said hollow cylinder.

11. The magnet system of claim 6, wherein said magnetic regenerator material only includes regions of said regenerator material having magnetization fluctuations during regenerator operation which exceed 10% of maximum magnetization fluctuations within an entire regenerator material.

12. The magnet system of claim 1, wherein at least one part of said magnetic material is not magnetically saturated during operation.

13. The magnet system of claim 1, wherein said shielding of magnetic material is temperature stabilized or is connected in a thermally conducting fashion to a radiation shield, to a cold stage of said pulse tube cooler, or to a container of cryogenic liquid.

14. The magnet system of claim 1, wherein said shielding of magnetic material is thermally insulated from said magnetic regenerator material.

15. The magnet system of claim 1, further comprising a shielding material having good electrical conducting properties which is disposed around said magnetic regenerator material.

16. The magnet system of claim 15, wherein said shielding material having good electrical conducting properties has cylindrically symmetrical parts, wherein magnetic field changes of said magnetic regenerator material and/or of said magnetic shielding at a location of said shielding having good electrical conducting properties are substantially parallel to an associated cylinder axis of said shielding material having good electrical conducting properties.

17. The magnet system of claim 15, wherein said shielding material having good electrical conducting properties is a low-temperature superconductor.

18. The magnet system of claim 15, wherein said shielding material having good electrical conducting properties is a high-temperature superconductor.

19. The magnet system of claim 15, wherein said shielding material having good electric conducting properties consists essentially of bulk material.

20. The magnet system of claim 15, wherein said shielding material having good electric conducting properties defines a solenoid coil.

21. The magnet system of claim 1, wherein said magnet arrangement comprises coils for stray field suppression.

22. The magnet system of claim 21, wherein a magnetic field does not exceed 10 mT at a location of said magnetic regenerator material.

23. The magnet system of claim 1, wherein said magnet arrangement comprises coils which suppress electromagnetic disturbances of said magnetic regenerator material.

24. The magnet system of claim 1, wherein said magnet arrangement comprises coils which suppress electromagnetic disturbances of said magnetic shielding due to vibration thereof.

25. The magnet system of claim 2, wherein said cryostat contains a radiation shield which is brought to its operating temperature by said pulse tube cooler.

26. The magnet system of claim 2, wherein said cryostat has a container of liquid nitrogen which is at least partially re-liquefied by said pulse tube cooler after evaporation thereof.

27. The magnet system of claim 2, wherein said magnet arrangement is cooled with liquid helium which is at least partially re-liquefied by said pulse tube cooler after evaporation thereof.

28. The magnet system of claim 2, wherein said superconducting magnet arrangement is brought to and/or kept at its operating temperature by said pulse tube cooler, without the assistance of a cryogenic liquid.

29. The magnet system of claim 2, wherein said superconducting magnet arrangement is part of an apparatus for nuclear magnetic resonance, for magnetic resonance imaging (MRI), or for magnetic resonance spectroscopy (NMR).

30. A method for operating the magnet system of claim 17, wherein said shielding material having good electrical properties is a superconducting material which is inductively charged during charging of said magnet arrangement.

* * * * *